(12) United States Patent
Tang et al.

(10) Patent No.: US 12,354,699 B2
(45) Date of Patent: Jul. 8, 2025

(54) SENSING AMPLIFIER CIRCUIT AND MEMORY DEVICE

(71) Applicant: Vanguard International Semiconductor Corporation, Hsinchu (TW)

(72) Inventors: Po-Yuan Tang, Hsinchu (TW); Chih-Chuan Ke, New Taipei (TW); Jian-Yuan Hsiao, Hsinchu (TW); Yi-Ling Hung, Taoyuan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 139 days.

(21) Appl. No.: 18/500,394

(22) Filed: Nov. 2, 2023

(65) Prior Publication Data
US 2025/0149071 A1    May 8, 2025

(51) Int. Cl.
*G11C 7/06*    (2006.01)
*G11C 17/16*    (2006.01)
*G11C 17/18*    (2006.01)

(52) U.S. Cl.
CPC ............ *G11C 7/06* (2013.01); *G11C 17/16* (2013.01); *G11C 17/18* (2013.01)

(58) Field of Classification Search
CPC ............ G11C 7/06; G11C 17/16; G11C 17/18
USPC .......................................................... 365/96
See application file for complete search history.

(56) References Cited

U.S. PATENT DOCUMENTS

2017/0365347 A1* 12/2017 Yanagidaira ........... G11C 16/26

* cited by examiner

*Primary Examiner* — Huan Hoang
(74) *Attorney, Agent, or Firm* — Birch, Stewart, Kolasch & Birch, LLP (57) ABSTRACT

A sensing amplifier circuit includes first and second P-type transistors and first and second N-type transistors. The first P-type transistor includes a gate coupled to an input node, a source and a bulk coupled to a first node, and a drain coupled to an output node. The second P-type transistor includes a gate coupled to an inverted reading-triggered signal, a source coupled to a voltage source, and a drain coupled to the first node. The first N-type transistor includes a gate coupled to the input node, a drain coupled to the output node, and a source coupled to ground. The second N-type transistor includes a gate receiving the inverted reading-triggered signal, a drain coupled to the output node, and a source coupled to the ground. The first P-type transistor includes an N-type well region that is electrically connected to the source and bulk of the first P-type transistor.

14 Claims, 4 Drawing Sheets

SENSING AMPLIFIER CIRCUIT AND MEMORY DEVICE

BACKGROUND OF THE INVENTION

Field of the Invention

The present invention relates to a sensing amplifier circuit of a memory device.

Description of the Related Art

A plurality of sensing amplifiers are configured in a memory device to sense and amplify voltages or signals read from memory cells to generate a corresponding data signal. Generally, a sensing amplifier comprises an inverter composed of a set of a P-type transistors and an N-type transistor. The bulk of the P-type transistor of the inverter is usually connected to a voltage source so that the N-type well region of the P-type transistor has the high voltage of the voltage source. When the input terminal of the inverter is pulled to a low level or a level of 0 volts, the voltage difference between the gate of the P-type transistor and the N-well region is large, which causes a large electric field between the gate of the P-type transistor and the N-well region. Therefore, the P-type transistors has significant negative bias temperature instabilities (NBTI), which reduces the sensing accuracy of the sensing amplifier.

BRIEF SUMMARY OF THE INVENTION

The invention provides one exemplary embodiment of a sensing amplifier circuit. The sensing amplifier circuit is coupled to a memory cell through a data line and comprises a first P-type transistor, a second P-type transistor, a first N-type transistor, and a second N-type transistor. The first P-type transistor comprises a gate coupled to the data line at an input node, a source and a bulk coupled to a first node, and a drain coupled to an output node. The second P-type transistor comprises a gate coupled to an inverted reading-triggered signal, a source coupled to a voltage source, and a drain coupled to the first node. The first N-type transistor comprises a gate coupled to the input node, a drain coupled to the output node, and a source coupled to a ground. The second N-type transistor comprises a gate receiving the inverted reading-triggered signal, a drain coupled to the output node, and a source coupled to the ground. The first P-type transistor further comprises an N-type well region, and the source and bulk of the first P-type transistor are electrically connected to the N-type well region.

The invention provides an exemplary embodiment of a memory device. The memory device comprises a selection switch, a memory cell, and a sensing amplifier circuit. The selection switch is coupled between a first voltage source and a first node. The selection switch is controlled by an inverted selection signal. The first node is coupled to a word line. The memory cell is coupled between the first node and a data line. The memory cell is controlled by a programming signal, a reading-triggered signal, and a first inverted reading-triggered signal. The sensing amplifier circuit is coupled to the data line and comprises a first P-type transistor, a second P-type transistor, a first N-type transistor, and a second N-type transistor. The first P-type transistor comprises a gate coupled to the data line at an input node, a source and a bulk coupled to a second node, and a drain coupled to an output node. The second P-type transistor comprises a gate receiving a second inverted reading-triggered signal, a source coupled to a second voltage source, and a drain coupled to the second node. The first N-type transistor comprises a gate coupled to the input node, a drain coupled to the output node, and a source coupled to a ground. The second N-type transistor comprises a gate receiving the second inverted reading-triggered signal, a drain coupled to the output node, and a source coupled to the ground. The first P-type transistor further comprises an N-type well region, and the source and bulk of the first P-type transistor are electrically connected to the N-type well region.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
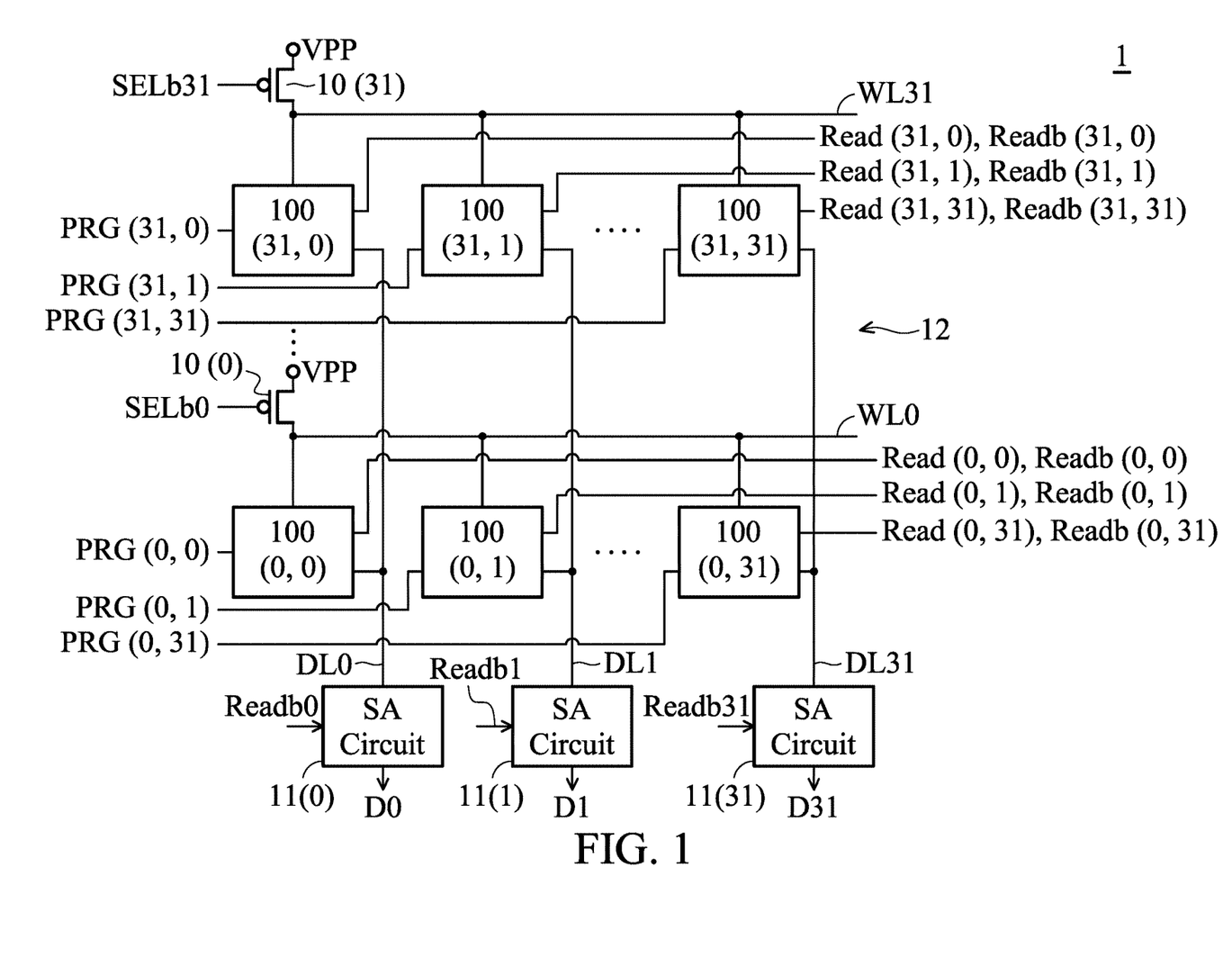
FIG. 1 shows an exemplary embodiment of a memory device.

FIG. 1 shows an exemplary embodiment of a memory device. As shown in FIG. 1, the memory device 1 comprises a plurality of word lines, a plurality of data lines, a plurality of selection switches, a plurality of memory cells, and a complex sensing amplifier (SA) circuits. In the embodiment of FIG. 1, 32 word lines WL0-WL31 and 32 data lines DL0-DL31 are taken as an example for explanation. The plurality of memory cells are configured into a memory array 12 having a plurality of columns and a plurality of rows, and each memory cell is coupled to a set of a word line and a data line. The memory cells arranged in the same column are coupled to the same word line, and the memory cells arranged in the same row are coupled to the same data line. For example, the memory cells 100(0,0)-100(0,31) arranged in the same column are coupled to the word line WL0 and respectively coupled to the data lines DL0-DL31; the memory cells 100(31,0)-100(31,31) arranged in the same column are coupled to the word line WL31 and respectively coupled to the data lines DL0-DL31. In other words, the memory cells 100(0,0)-100(31,0) arranged in the same row are coupled to the data line DL0 and respectively coupled to the word lines WL0-WL31; the memory cells arranged in the same row 100(0,31)-100(31,31) are coupled to the data line DL31 and respectively coupled to the word lines WL0-WL31.

Each memory cell receives a corresponding programming signal and is controlled by the corresponding programming signal. Each memory cell further receives two reading-triggered signals that are inverse to each other. Referring to FIG. 1, the memory cells 100(0,0)-100(0,31) receive programming signals PRG(0,0)-PRG(0,31) respectively, and memory cells 100(31,0)-100(31,31) receives the programming signals PRG(31,0)-PRG(31,31) respectively. The memory cell 100(0,0) receives the reading-triggered signal Read(0,0) and the inverted reading-triggered signal Readb(0,0) that are inverse to each other. The memory cell 100(0,1) receives the reading-triggered signal Read(0,1) and the inverted reading-triggered signal Readb(0,1) that are inverse to each other. The memory cell 100(0,31) receives the reading-triggered signal Read(0,31) and the inverted reading-triggered signal Readb(0,31) that are inverse to each other. The memory cell 100(31,0) receives the reading-triggered signal Read(31,0) and the inverted reading-triggered signal Readb(31,0) that are inverted to each other which are inverse to each other. The memory cell 100(31,1) receives the reading-triggered signal Read(31,1) and the inverted reading-triggered signal Readb(31,1) that are inverse to each other. The memory cell 100(31,31) receives the reading-triggered signal Read(0,31) and the inversed reading-triggered signal Readb(31,31) that are inverse to each other.

The plurality of sensing amplifier circuits are coupled to the data lines DL0-DL31, and one data line is coupled to one sensing amplifier circuit. Therefore, the memory device 1 comprises 32 sensing amplifier circuits 11(0)-11(31). In the embodiment, the sensing amplifier circuits 11(0)-11(31) receive the inverted reading-triggered signals Readb0-Readb31 respectively. When one of the inverted reading-triggered signals Readb0-Readb31 is disabled, the corresponding sensing amplifier circuit performs a sensing operation to generate a corresponding data signal. For example, when the inverted reading-triggered signal Readb0 is disabled, the sensing amplifier circuit 11(0) performs the sensing operation to generate the data signal D0; when the inverted reading-triggered signal Readb1 is disabled, the sensing amplifier circuit 11(1) performs the sensing operation to generate the data signal D1; when the inverted reading-triggered signal Readb31 is disabled, the sensing amplifier circuit 11(31) performs the sensing operation to generate the data signal D31.

The selection switches 10(0)-10(31) are implemented with P-type transistors. In the subsequent description, the selection switches 10(0)-10(31) will be referred to as P-type transistors. As shown in FIG. 1, the P-type transistors 10(0)-10(31) are respectively coupled to the word lines WL0-WL31, and are respectively controlled by inverted selection signals SELb0-SELb31. The P-type transistors 10(0)-10(31) are all coupled to a voltage source VPP. For example, the gate of the P-type transistor 10(0) receives the corresponding inverted selection signal SELb0, the source thereof is coupled to the voltage source VPP, and the drain thereof is coupled to the corresponding word line WL0.

The memory device 1 may operate in a writing mode, a reading mode, or a standby mode. When a writing or programming operation is performed on at least one memory cell in the writing mode, one of the P-type transistors 10(0)-10(31) is turned on by disabling the corresponding one of the inverted selection signals SELb0-SELb31, thereby selecting one word line. In the embodiment, based on the conductivity type of the P-type transistors 10(0)-10(31), the disabled inverted selection signal among the inverted selection signals SELb0-SELb31 has a low voltage level. For example, when the inverted selection signal SELb0 is disabled to be at a low voltage level, the P-type transistor 10(0) is turned on to select the word line WL0. At this time, at least one of the programming signals PRG(0,0)-PRG(0,31) is enabled to select a corresponding memory cell. In the embodiment, the enabled programming signal among the programming signals PRG(0,0)-PRG(0,31) has a high voltage level. Accordingly, by controlling the enabled/disabled states of the inverted selection signals SELb0-SELb31 and the programming signals PRG(0,0)-PRG(31,31), the selection operation performed on at least one memory cell in the writing mode can be achieved.

In the writing mode, the selected memory cell is programmed by the current caused by the voltage source VPP to achieve the writing operation.

When a reading operation is performed on at least one memory cell in the reading mode, one of the P-type transistors 10(0)-10(31) is turned on by disabling the corresponding one of the inverted selection signals SELb0-SELb31, thereby selecting one word line. For example, when the inverted selection signal SELb0 is disabled to be at the low voltage level, the P-type transistor 10(0) is turned on to select the word line WL0. At this time, the reading-triggered signal and the inverted reading-triggered signal of at least one of the memory cells 10(0,0)-10(0,31) coupled to the word line WL0 are enabled and disabled respectively. Accordingly, by controlling the enable/disable states of the inverse selection signals SELb0-SELb31 and controlling the respective reading-triggered signals and inverted reading-triggered signals of the memory cells, the selection operation performed on at least one memory in the reading mode can be achieved.

In the reading mode, the reading-triggered signal and the inverted reading-triggered signal of the selected memory cell are enabled and disabled respectively to trigger the reading operation, and the sensing amplifier circuit coupled to the selected memory cell performs the sensing operation to generate a corresponding data signal. For example, in the case where the inverted selection signal SELb0 is disabled, when the reading-triggered signal Read(0,0) and the inverted reading-triggered signal Readb(0,0) are enabled and disabled respectively, the memory cell 100(0,0) is selected. In the embodiment, the enabled reading-triggered signal Read(0,0) has a high voltage level, and the disabled inverted reading-triggered signal Readb(0,0) has a low voltage level. At this time, the inverted reading-triggered signal Readb0 is disabled so that the sensing amplifier 11(0) circuit coupled to the memory cell 100(0,0) through the data line DL0 performs the sensing operation to generate the data signal D0.

In the standby mode, the above-mentioned selection operation for the memory cells is not performed, and the reading-triggered signal and the inverted reading-triggered signal of each memory cell are respectively disabled and enabled. For example, the reading-triggered signal Read(0,0) and the inverted reading-triggered signal Readb(0,0) of the memory cell 100(0,0) are disabled and enabled respectively. In the embodiment, the disabled reading-triggered signal Read(0,0) has a low voltage level, and the enabled inverted reading-triggered signal Readb(0,0) has a high voltage level. At this time, no signal or data is read from the memory cell(s). In the standby mode, the inverted reading-triggered signals Readb0-Readb31 are all enabled to reset the sensing amplifier circuits 11(0)-11(31) so that the data signals D0-D31 are at a preset low voltage level. In the embodiment, the enabled inverted reading-triggered signal is at a high voltage level.

The operation of the memory device 1 will be described below by taking the memory cell 100(0,0) and the P-type transistor 10(0) and the sensing amplifier circuit 11(0) that are coupled to the memory cell 100(0,0) as an example.

Figure 2:
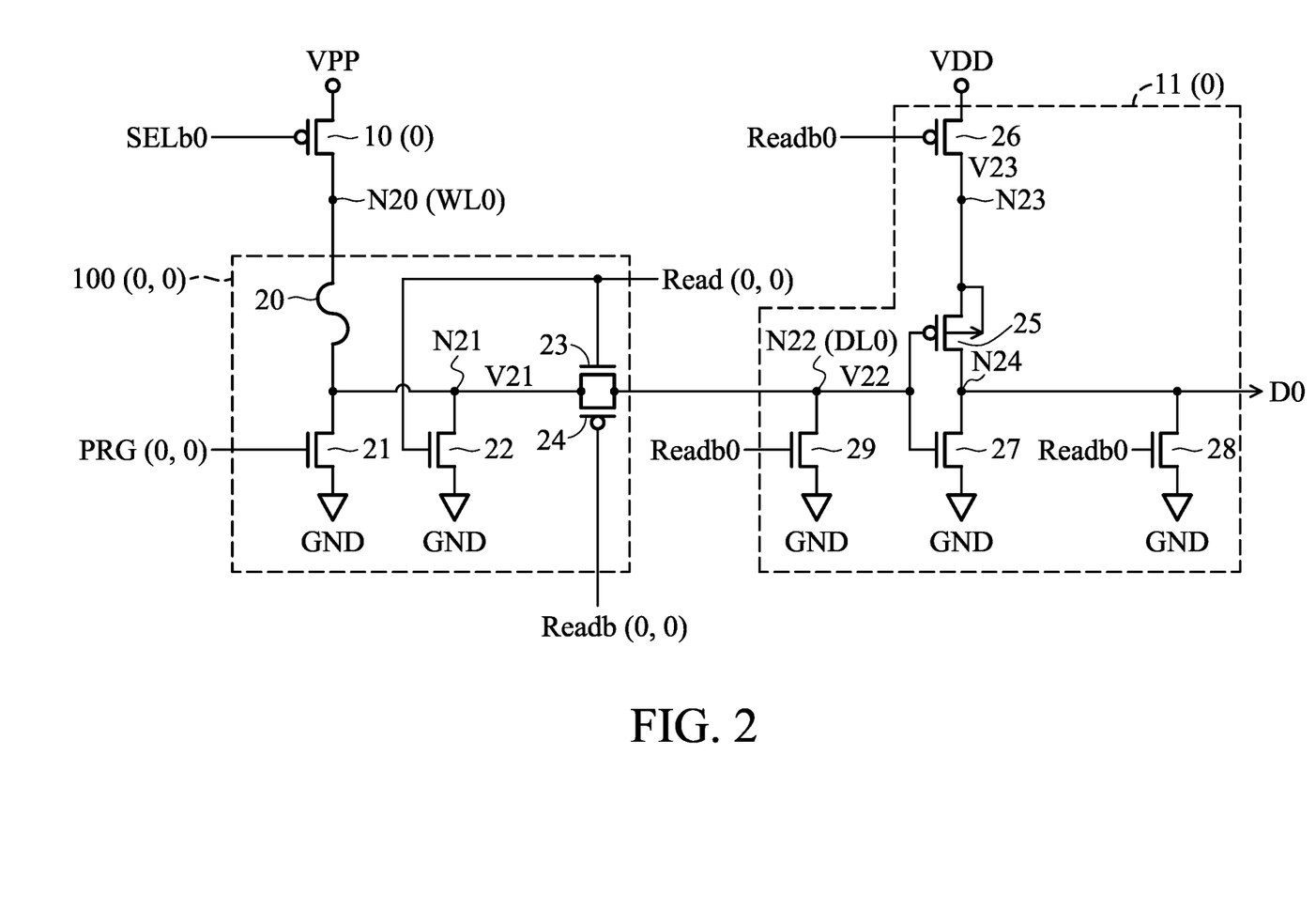
FIG. 2 shows one exemplary embodiment of a memory cell and a sensing amplifier circuit.

Referring to FIG. 2, the memory cell 100(0,0) comprises a fuse cell 20, N-type transistors 21-23, and a P-type transistor 24. The first terminal of the fuse cell 20 is coupled to the drain of the P-type transistor 10(0) at a node N20, and the second terminal thereof is coupled to a node N21. Referring FIGS. 1-2, the memory cell 100(0,0) is coupled to the word line WL0 through the node N20. The gate of the N-type transistor 21 receives the programming signal PRG(0,0), its drain thereof is coupled to the node N21, and the source thereof is coupled to the ground GND. The gate of the N-type transistor 22 receives the reading-triggered signal Read(0,0), the drain thereof is coupled to the node N21, and the source thereof is coupled to the ground GND.

The gate of the N-type transistor 23 receives the reading-triggered signal Read(0,0), the drain thereof is coupled to the node N21, and the source thereof is coupled to an input node N22. The gate of the P-type transistor 24 receives the inverted reading-triggered signal Readb(0,0), the source thereof is coupled to the node N21, and the drain thereof is coupled to the input node N22. Referring to FIGS. 1-2, the input node N22 is coupled to the data line DL0. According to the connection structure between the N-type transistor 23 and the P-type transistor 24 and further according to the received reading-triggered signal Read(0,0) and inverted reading-triggered signal Readb(0,0) which are inverse to each other, the N-type transistor 23 and the P-type transistor 24 form a transmission gate.

In the embodiment, the P-type transistor 10(0) and the N-type transistor 21 have larger sizes, while the N-type transistor 22 has a smaller size. Therefore, compared with the P-type transistor 10(0) and the N-type transistor 21, the N-type transistor 22 has a larger equivalent resistance value.

The sensing amplifier circuit 11(0) comprises P-type transistors 25 and 26 and N-type transistors 27-29. The gate of the P-type transistor 25 is coupled to the input node N22 and then to the data line DL0, the source and bulk thereof are coupled to a node N23, and the drain thereof is coupled to an output node N24. The P-type transistor 25 comprises an N-type well region, and the source and bulk of the P-type transistor 25 are electrically connected to the N-type well region. The gate of the P-type transistor 26 receives the inverted reading-triggered signal Readb0, the source thereof is coupled to a voltage source VDD, and the drain thereof is coupled to the node N23. The gate of the N-type transistor 27 is coupled to the input node N22, the drain thereof is coupled to the output node N24, and the source thereof is coupled to the ground GND. The gate of the N-type transistor 28 receives the inverted reading-triggered signal Readb0, the drain thereof outputs the node N24, and the source thereof is coupled to the ground GND. The gate of the N-type transistor 29 receives the inverted reading-triggered signal Readb0, the drain thereof is coupled to the input node N22, and the source thereof is coupled to the ground GND.

In one embodiment, the P-type transistor 25 has a double guard ring structure to prevent the latch-up effect in the P-type transistor 25.

When the memory device 1 operates in the writing mode to perform the writing or programming operation on the memory cell 100(0,0), the inverted selection signal SELb0 is disabled and has a low voltage level to turn on the P-type transistor 10(0), and the programming signal PRG(0,0) is enabled to have a high voltage level to turn on the N-type transistor 21. At this time, a large current flows from the voltage source VPP and through the P-type transistor 10(0), the fuse cell 20, and the N-type transistor 21 to burn out the fuse cell 20. The burned-out fuse cell 20 is in an open-circuit state and has a large resistance value.

When the memory device 1 operates in the reading mode to perform the reading operation on the memory cell 100(0,0), the inverted selection signal SELb0 is disabled to have a low voltage level to turn on the P-type transistor 10(0), and the reading-triggered signal Read(0,0) and the inverted reading-triggered signal Readb(0,0) are enabled and disabled respectively. The enabled reading-triggered signal Read(0,0) has a high voltage level to turn on the N-type transistors 22 and 23, and the disabled inverted reading-triggered signal Readb(0,0) has a low voltage level turns on the P-type transistor 24. In addition, the programming signal PRG(0,0) is disabled to have a low voltage level to turn off the N-type transistor 21. As described above, the N-type transistor 22 has a large equivalent resistance value. Therefore, due to the limitation induced by the larger equivalent resistance value of the N-type transistor 22, the current flowing from the voltage source VPP and through the P-type transistor 10(0), the fuse cell 20, and the N-type transistor 22 is small. In this way, in the reading mode, the unblown fuse cell 20 will not be accidentally burned out by the above-mentioned smaller current. Based on the above-mentioned smaller current and the resistance value of the fuse cell 20, a voltage V21 is generated on the node N21.

As mentioned above, both the N-type transistor 23 and the P-type transistor 24 are turned on, and, thus, the voltage V22 at the input node N22 is equal to the voltage V21. The voltage V22 serves as the voltage read from the memory cell 100(0,0), which indicates whether the fuse cell 20 is burned out. The voltage V22 also indicates the data stored in the memory cell 100(0,0). When the fuse cell 20 is burned out, the voltages V21 and V22 have lower voltage levels (for example, voltage levels close to the ground GND or 0 volts (V)); when the fuse cell 20 is not burned out, the voltage V21 and V22 have higher voltage levels (for example, the voltage levels close to the voltage level of voltage source VPP).

Moreover, in the reading mode, the inverted reading-triggered signal Readb0 is disabled to have a low voltage level to turn off the N-type transistors 28 and 29 and turn on the P-type transistor 26. At this time, the source of the P-type transistor 25 is coupled to the voltage source VDD, and the P-type transistor 25 and the N-type transistor 27 perform an inverting operation according to the voltage V22 at the input node N22 to generate the data signal D0 at the output node N24. The data signal D0 represents the data stored in the memory cell 100(0,0).

In the standby mode, the inverted selection signal SELb0 is enabled to turn off the P-type transistor 10(0), and the reading-triggered signal and the inverted reading-triggered signal of each memory cell are disabled and enabled respectively. able. For example, the reading-triggered signal Read(0,0) and the inverted reading-triggered signal Readb(0,0) are disabled and enabled respectively. The disabled reading-triggered signal Read(0,0) has a low voltage level to turn off the N-type transistors 22 and 23, and the enabled inverted reading-triggered signal Readb(0,0) has a high voltage level to turn off the P-type transistor 24. Therefore, the memory device 1 does not perform the writing operation or the reading operations on the memory cell 100(0,0).

In addition, in the standby mode, the inverted reading-triggered signal Readb0 is enabled to have a high voltage level to turn on the N-type transistors 28 and 29 and turn off the P-type transistor 26. Since the N-type transistor 28 is turned on, the voltage at the output node N24 (that is, the voltage at the drain of the P-type transistor 25) is close to or equal to 0V of the ground GND, that is, the data signal D0 is reset to a preset low level. voltage level. Moreover, since the N-type transistor 29 is turned on, the voltage V22 at the input node N22 (that is, the voltage at the gate of the P-type transistor 25) is close to or equal to 0V of the ground GND, thereby turning on the P-type transistor 25 and turning off the N-type transistor 27. Since the P-type transistor 26 is turned off, the source and the bulk of the P-type transistor 25 are isolated from the voltage source VDD so that the node N23 (that, the source and bulk of the P-type transistor 25) is in a floating state. The voltage V23 at the node N23 (that is, the voltage at the source and the voltage at the bulk of the P-type transistor 25) is discharged from the high voltage level of the remaining voltage stored in the parasitic capacitance at the node N23 on the node N23 through the turned-on P-type transistor 25 and the turned-on N-type transistor 28 until the voltage V23 is equal to the threshold voltage (Vtp) of the P-type transistor 25.

According to the above description, the bulk of the P-type transistor 25 is electrically connected to the N-type well region. Therefore, the voltage of the N-type well region of the P-type transistor 25 is equal to the threshold voltage (Vtp) of the P-type transistor 25. Accordingly, the voltage difference between the gate and the N-type well region of the P-type transistor 25 is equal to the threshold voltage (Vtp), which is about a low level of 0.7V. The vertical electric field between the gate and the N-type well region of the P-type transistor 25 is small, which reduces or eliminates the negative bias temperature instabilities (NBTI) of the P-type transistor 25, thereby improving the sensing accuracy of the sensing amplifier circuit 11(0).

Furthermore, according to the above description, in the standby mode, the voltage V22 at the input node N22 is close to or equal to 0V of the ground GND, and the voltage at the output node N24 is close to or equal to 0V of the ground GND. Therefore, the voltages at the gate, drain, source, and bulk of the N-type transistor 27 are all close to or equal to 0V of the ground GND, which also reduces or eliminates the positive bias temperature instabilities (PBTI) of the N-type transistor 27.

Figure 3:
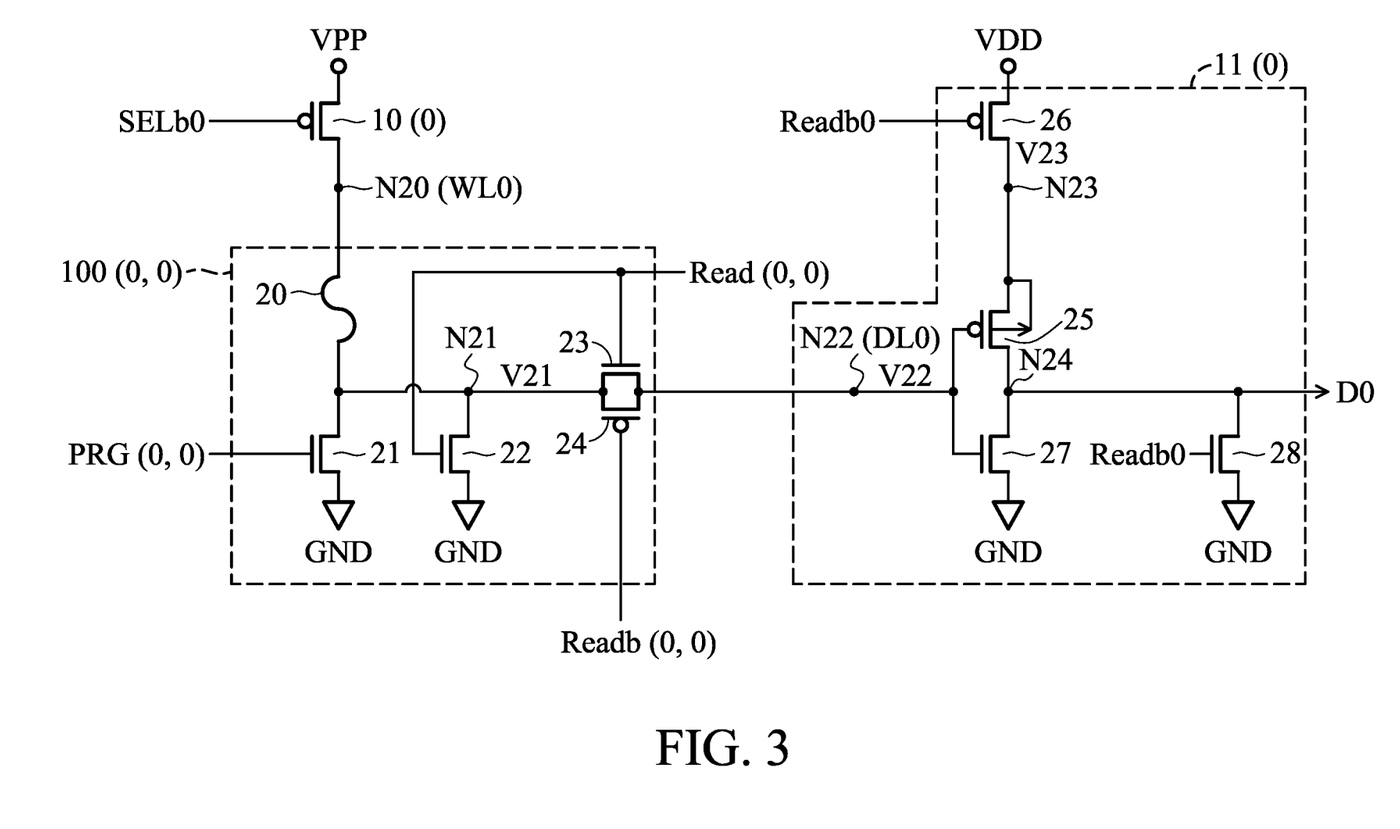
FIG. 3 shows another exemplary embodiment of a memory cell and a sensing amplifier circuit.

In other embodiments, the N-type transistor 29 may not be disposed in sensing amplifier circuit 11(0). Referring to FIG. 3, the sensing amplifier circuit 11(0) does not comprise the N-type transistor 29. In the embodiment of FIG. 3, the operations of the P-type transistor 10(0), the memory cell 100(0,0), and the sensing amplifier circuit 11(0) in the writing mode and the reading mode are similar to the operations thereof in the embodiment of FIG. 2 as disclosed in the previous paragraphs, and the related description is omitted here.

In the embodiment of FIG. 3, in the standby mode, the inverted selection signal SELb0 is enabled to turn off the P-type transistor 10(0), and the reading-triggered signal and the inverted reading-triggered signal of each memory cell are disabled and enabled respectively. For example, the reading-triggered signal Read(0,0) and the inverted reading-triggered signal Readb(0,0) are disabled and enabled respectively. The disabled reading-triggered signal Read(0,0) has a low voltage level to turn off the N-type transistors 22 and 23, and the enabled inverted reading-triggered signal Readb(0, 0) has a high voltage level to turn off the P-type transistor 24. Therefore, the memory device 1 does not perform the writing operation and the reading operation on the memory cell 100(0,0).

In addition, in the standby mode, the inverted read signal Readb0 is enabled to have a high voltage level to turn on the N-type transistor 28 and turn off the P-type transistor 26. Since the N-type transistor 28 is turned on, the voltage at the output node N24 (that is, the voltage at the drain of the P-type transistor 25) is close to or equal to 0V of the ground GND, that is, the data signal D0 is reset to a preset low voltage level. Since the P-type transistor 26 is turned off, the source and the bulk of the P-type transistor 25 are isolated from the voltage source VDD so that the node N23 (that is, the source and the bulk of the P-type transistor 25) is in a floating state. However, since the P-type transistor 26 has just been turned off, the voltage V23 at the node N23 is initially be floating but close to or equal to the voltage source VDD.

In the embodiment of FIG. 3, in the standby mode, since the memory device 1 does not perform the reading operation on the memory cell 100(0,0), the voltage V22 at the input node N22 (that is, the voltage V22 at the gate of the P-type transistor 25) is also in a floating state.

It assumed that when the voltage V22 at the input node N22 is in the floating state and is close to or equal to 0V of the ground GND, the P-type transistor 25 is turned on, and the N-type transistor 27 is turned off. The voltage V23 at the node N23 (that is, the voltage at the source and the voltage at the bulk of the P-type transistor 25) is discharged through the turned-on P-type transistor 25 and the turned-on N-type transistor 28, until the voltage V23 becomes equal to the threshold voltage (Vtp) of the P-type transistor 25. According to the above description, the bulk of the P-type transistor 25 is electrically connected to the N-type well region. Therefore, the voltage of the N-type well region of the P-type transistor 25 is equal to the threshold voltage (Vtp) of the P-type transistor 25. Accordingly, the voltage difference between the gate and the N-type well region of the P-type transistor 25 is equal to the threshold voltage (Vtp), which is about the low level of 0.7V. The vertical electric field between the gate and the N-type well region of the P-type transistor 25 is small, which reduces or eliminates the negative bias temperature instability (NBTI) of the P-type transistor 25, thereby improving the sensing accuracy of the sensing amplifier circuit 11(0).

It is assumed that when the voltage V22 at the input node N22 is in the floating state and is close to or equal to the voltage of the voltage source VDD, the P-type transistor 25 is turned off. According to the above description, the voltage V23 at the node N23 is initially equal to the voltage of the voltage source VDD. Therefore, the voltage difference between the gate and the N-type well region of the P-type transistor 25 is equal to 0V. There is no vertical electric field between the gate and the N-type well area of the P-type transistor 25, thus eliminating the negative bias temperature instability (NBTI) of the P-type transistor 25.

It is assumed that when the voltage V22 at the input node N22 is in the floating state and is between 0V and the voltage of the voltage source VDD, both the P-type transistor 25 and the N-type transistor 27 are turned on. Therefore, the voltage V23 at the node N23 is equal to (voltage V22+Vpt). The voltage difference between the gate and the N-type well region of the P-type transistor 25 is equal to the threshold voltage (Vtp), which is approximately 0.7V at the low level. The vertical electric field between the gate and the N-type well area of the P-type transistor 25 is small, which reduces or eliminates the negative bias temperature instability (NBTI) of the P-type transistor 25.

In other cases, when the memory device 1 performs the writing or programming operation on the memory cell 100(0,0) to write predetermined data into the memory cell 100(0,0), the fuse cell 20 may not be completely burned out (weakly programmed) to has a smaller resistance value. In the reading mode, the voltage V22 at the input node N22 occurring when the fuse cell 20 is not completely burned out has a higher value than the voltage V22 at the input node N22 occurring when the fuse cell 20 is completely burned out, which will affect the sensing accuracy of the sensing amplifier circuit 11(0) so that the data signal D0 cannot correctly represent the predetermined data stored in the memory cell 100(0,0).

Figure 4:
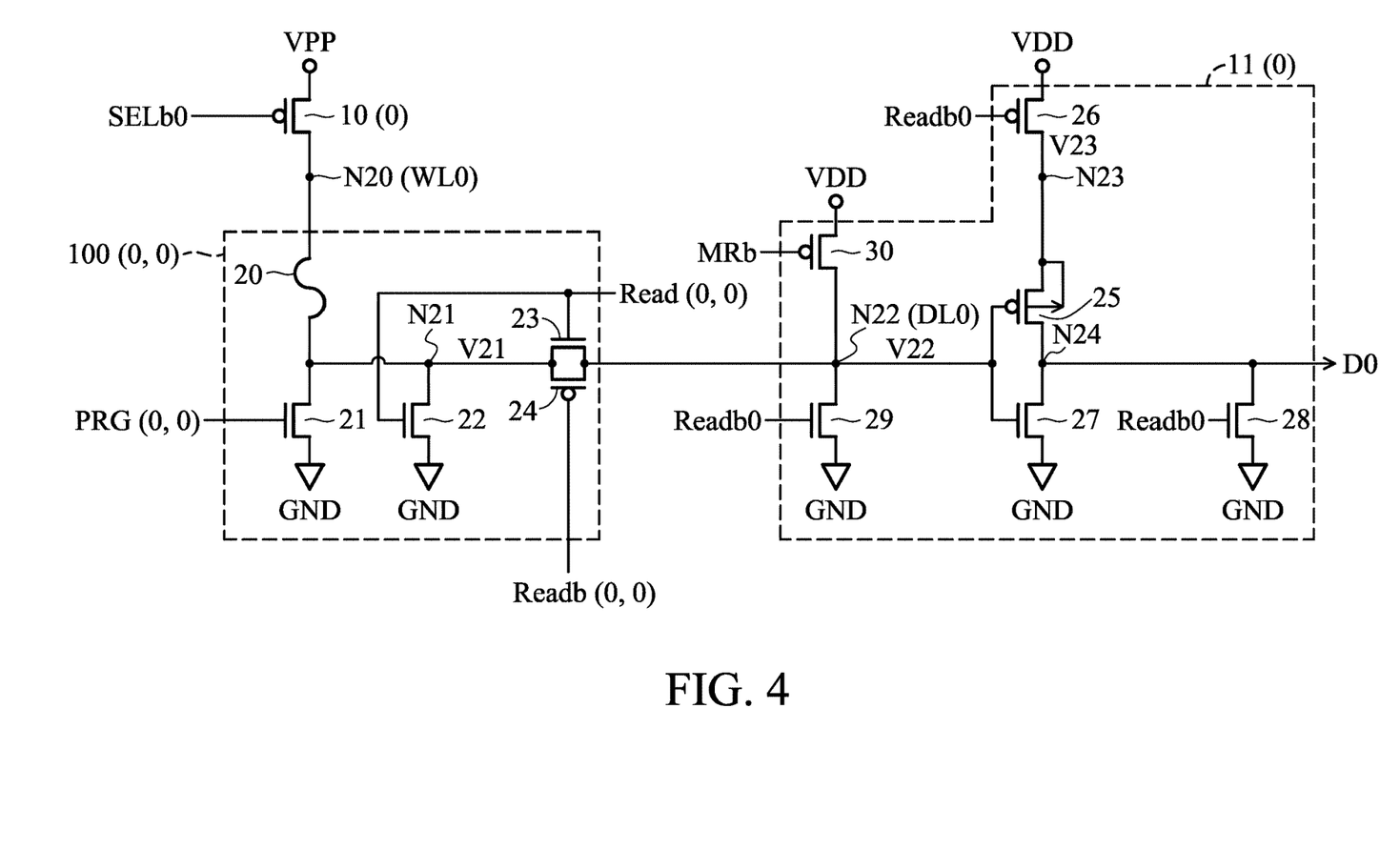
FIG. 4 shows another exemplary embodiment of a memory cell and a sensing amplifier circuit.

In other embodiments, the voltage V22 can be increased by a specific voltage level, and the amplifier circuit 11(0) can accurately perform the sensing operation to generate the data signal D0 that accurately represents the predetermined data stored in the memory cell 100(0,0). In this way, such fuse cells 20 that may not be completely burned out (weakly programmed) can be detected early. Referring to FIG. 4, the sensing amplifier circuit 11(0) further comprises a P-type transistor 30. The gate of the P-type transistor 30 receives a inverted marginal-reading enabled signal MRb, the source thereof is coupled to the voltage source VDD, and the drain thereof is coupled to the input node N22. The P-type transistor 30 is used to simulate the level of the voltage V22 that can correctly represent the predetermined data stored in the memory cell 100(0,0) when the fuse cell 20 is not completely burned out, wherein the predetermined data corresponds to the completely burned-out fuse cell 20.

In any of the writing mode, the reading mode, and the standby mode of the memory device 1, the inverted marginal-reading enabled signal MRb is enabled to have a high voltage level to turn off the P-type transistor. 30. At this time, the operations of the P-type transistor 10(0), the memory cell 100(0,0), and the sensing amplifier circuit 11(0) are the same as the embodiment in FIG. 2 as disclosed in the previous paragraphs, and the related description is omitted here.

In the embodiment of FIG. 4, the memory device 1 can alternatively operate in a marginal reading mode. In the marginal reading mode, the memory device 1 performs the reading operation on the memory cell 100(0,0) to generate the voltage V22 at the input node N22 as described in the embodiment of FIG. 2, and the operations of the components 26-29 in the sensing amplifier circuit 11(0) are similar to the operations thereof in the embodiment in FIG. 2 to generate the data signal D0. In addition, in the marginal reading mode, the inverted marginal-reading enabled signal MRb is disabled to has a low voltage level to turn on the P-type transistor 30. In the marginal reading mode, according to the voltage of the voltage source VDD and the size of the P-type transistor 30, the voltage V22 at the input node N22 is increased by a specific voltage level. By adjusting the size or parameter settings of the components in the sensing amplifier circuit 11(0), the sensing amplifier circuit 11(0) can generate the data signal D0, which correctly presents the predetermined data stored in the memory cell 100(0,0), according to the voltage V22 that is increased by the specific voltage level. Accordingly, it is ensured that when the fuse cell 20 is completely burned out, the data signal D0 can still correctly represent the predetermined data stored in the memory cell 100(0,0). When the fuse cell 20, which should be completely burned out, is actually not completely burned out (weakly programmed), the data signal D0 can identify the predetermined data stored in the erroneous memory cell 100(0,0) in advance.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A sensing amplifier circuit coupled to a memory cell through a data line, comprising:
   a first P-type transistor comprising a gate coupled to the data line at an input node, a source and a bulk coupled to a first node, and a drain coupled to an output node;
   a second P-type transistor comprising a gate coupled to an inverted reading-triggered signal, a source coupled to a voltage source, and a drain coupled to the first node;
   a first N-type transistor comprising a gate coupled to the input node, a drain coupled to the output node, and a source coupled to a ground; and
   a second N-type transistor comprising a gate receiving the inverted reading-triggered signal, a drain coupled to the output node, and a source coupled to the ground,
   wherein the first P-type transistor further comprises an N-type well region, and the source and bulk of the first P-type transistor are electrically connected to the N-type well region.

2. The sensing amplifier circuit as claimed in claim 1, further comprising:
   a third N-type transistor comprising a gate receiving the inverted reading-triggered signal, a drain coupled to the input node, and a source coupled to the ground.

3. The sensing amplifier circuit as claimed in claim 1, further comprising:
   a third P-type transistor comprising a gate coupled to an inverted marginal-reading enabled signal, a source coupled to the voltage source, and a drain coupled to the input node.

4. The sensing amplifier circuit as claimed in claim 3, wherein:
   in response to the memory cell operating in one of a writing mode, a reading mode, and a standby mode, the inverted marginal-reading enabled signal is enabled, and
   in response to the memory cell operating in a marginal reading mode, the inverted marginal-reading enabled signal is disabled.

5. The sensing amplifier circuit as claimed in claim 1, wherein:
   in response to the memory cell operating in a standby mode, the inverted reading-triggered signal is enabled, and
   in response to the memory cell operating in a reading mode, the inverted reading-triggered signal is disabled.

6. The sensing amplifier circuit as claimed in claim 1, wherein the first P-type transistor has a double guard ring structure.

7. A memory device, comprising:
   a selection switch coupled between a first voltage source and a first node, and controlled by an inverted selection signal, wherein the first node is coupled to a word line;
   a memory cell coupled between the first node and a data line and controlled by a programming signal, a reading-triggered signal, and a first inverted reading-triggered signal; and
   a sensing amplifier circuit coupled to the data line,
   wherein the sensing amplifier circuit comprises:
      a first P-type transistor comprising a gate coupled to the data line at an input node, a source and a bulk coupled to a second node, and a drain coupled to an output node;
      a second P-type transistor comprising a gate receiving a second inverted reading-triggered signal, a source coupled to a second voltage source, and a drain coupled to the second node;

a first N-type transistor comprising a gate coupled to the input node, a drain coupled to the output node, and a source coupled to a ground; and a second N-type transistor comprising a gate receiving the second inverted reading-triggered signal, a drain coupled to the output node, and a source coupled to the ground, wherein the first P-type transistor further comprises an N-type well region, and the source and bulk of the first P-type transistor are electrically connected to the N-type well region.

8. The memory device as claimed in claim 7, wherein the sensing amplifier circuit further comprises:

a third N-type transistor comprising a gate receiving the second inverted reading-triggered signal, a drain coupled to the input node, and a source coupled to the ground.

9. The memory device as claimed in claim 7, wherein the sensing amplifier circuit further comprises:

a third P-type transistor comprising a gate coupled to an inverted marginal-reading enabled signal, a source coupled to the second voltage source, and a drain coupled to the input node.

10. The memory device as claimed in claim 9, wherein:

in response to the memory cell operating in one of a writing mode, a reading mode, and a standby mode, the inverted marginal-reading enabled signal is enabled, and in response to the memory cell operating in a marginal reading mode, the inverted marginal reading-enabled signal is disabled.

11. The memory device as claimed in claim 7, wherein:

in response to the memory cell operating in a standby mode, the second inverted reading-triggered signal is enabled, and in response to the memory cell operating in a reading mode, the second inverted reading-triggered signal is disabled.

12. The memory device as claimed in claim 7, wherein the first P-type transistor has a double guard ring structure.

13. The memory device as claimed in claim 7, wherein the memory cell comprises:

a fuse cell coupled between the first node and a third node;

a third N-type transistor comprising a gate for receiving the programming signal, a drain coupled to the third node, and a source coupled to the ground;

a fourth N-type transistor comprising a gate for receiving the reading-triggered signal, a drain coupled to the third node, and a source coupled to the ground;

a fifth N-type transistor comprising a gate receiving the reading-triggered signal, a drain coupled to the third node, and a source coupled to the data line; and a third P-type transistor comprising a gate receiving the first inverted reading-triggered signal, a source coupled to the third node, and a drain coupled to the data line.

14. The memory device as claimed in claim 13, wherein in response to the memory cell operating in a reading mode, the reading-triggered signal and the first inverted reading-triggered signal are enabled and disabled respectively.

* * * * *